(12) United States Patent
Goenka et al.

(10) Patent No.: US 6,217,783 B1
(45) Date of Patent: Apr. 17, 2001

(54) METHOD FOR STRENGTHENING AIR BRIDGE CIRCUITS

(75) Inventors: Lakhi Nandlal Goenka, Ann Arbor; Mohan R. Paruchuri, Canton, both of MI (US)

(73) Assignee: Visteon Global Technologies, Inc., Dearborn, MI (US)

( * ) Notice: Subject to any disclaimer, the term of this patent is extended or adjusted under 35 U.S.C. 154(b) by 0 days.

(21) Appl. No.: 09/203,147

(22) Filed: Dec. 1, 1998

(51) Int. Cl.$^7$ ....................................................... H05K 3/00
(52) U.S. Cl. ............................. 216/15; 430/313; 430/314
(58) Field of Search .............................. 216/15, 13, 17, 216/18; 430/314, 313

(56) References Cited

U.S. PATENT DOCUMENTS

| | | |
|---|---|---|
| 3,801,388 | 4/1974 | Akiyama et al. . |
| 4,289,846 * | 9/1981 | Parks et al. ............................ 427/89 |
| 4,404,059 | 9/1983 | Livshits et al. . |
| 5,219,713 * | 6/1993 | Robinson ............................ 430/314 |
| 5,738,797 | 4/1998 | Belke, Jr. et al. . |

\* cited by examiner

Primary Examiner—Thi Dang
(74) Attorney, Agent, or Firm—Leslie C. Hodges

(57) ABSTRACT

A multilayer circuit board having strengthened air bridge crossover structures, and additive and subtractive methods for producing the same, wherein the circuit includes specially designed metallic fortifying layers to mechanically and/or electrically fortify the circuit. A preferred embodiment includes air bridge structures having generally T-shaped cross-sections, which provide strengthened, mechanically robust air bridges which are especially resistant to damage from flexure and displacement due to physical impact, bending, thermal excursions, and the like.

14 Claims, 4 Drawing Sheets

METHOD FOR STRENGTHENING AIR BRIDGE CIRCUITS

BACKGROUND OF THE INVENTION

1. Field of the Invention

The present invention relates generally to multilayer circuit boards, and more particularly to multilayer circuit boards having air bridge circuits.

2. Disclosure Information

In the printed circuit board (PCB) industry, various methods are used to produce multilayer (i.e., two-or-more-layer) PCBs. U.S. Pat. No. 4,404,059 to Livshits et al. (hereinafter "Livshits") and Pat. Ser. No. 5,738,797 to Belke et al. (hereinafter "Belke"), both of which are incorporated herein by reference, describe "additive" processes for PCB construction, while U.S. Pat. No. 3,801,388 to Akiyama et al. (hereinafter "Akiyama"), also incorporated herein by reference, teaches a "subtractive" process for PCB manufacture. These additive and subtractive processes involve various masking, plating, mask-stripping, chemical etching, and other steps for constructing multilayer circuit boards having features known as "air bridges", "crossovers", "air bridge crossovers", and the like.

Air bridge crossover circuits are useful for creating high density circuits. However, such circuits sometimes suffer from susceptibility to mechanical damage, caused by physical impact, thermal excursions, and the like. It would be desirable, therefore, to provide a way of creating such multilayer air bridge circuits without this drawback.

SUMMARY OF THE INVENTION

The present invention overcomes the disadvantages of the prior art approaches by providing a multilayer air bridge circuit structure, and method for producing the same, which has special metallic fortifying layers which mitigate the aforementioned disadvantages.

It is an object and advantage that the present invention includes an air bridge circuit having metallic fortifying layers which mechanically and/or electrically enhance the circuit.

Another advantage is that the present invention may be easily and economically incorporated into both the additive and subtractive air bridge circuit construction processes.

These and other advantages, features and objects of the invention will become apparent from the drawings, detailed description and claims which follow.

DETAILED DESCRIPTION OF THE PREFERRED EMBODIMENTS

Figure 2A:
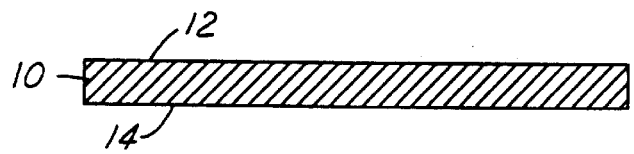
FIGS. 2A–H are successive sectional side views of a multilayer air bridge circuit being produced according to a first approach of the present invention.
Figure 2B:
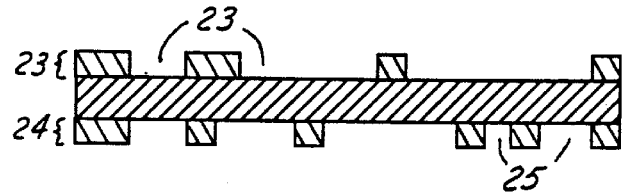
Figure 2C:
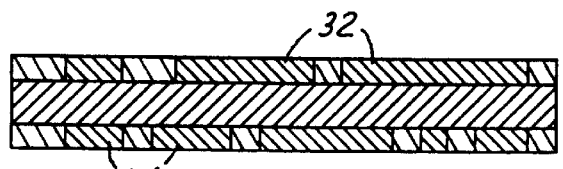
Figure 2D:
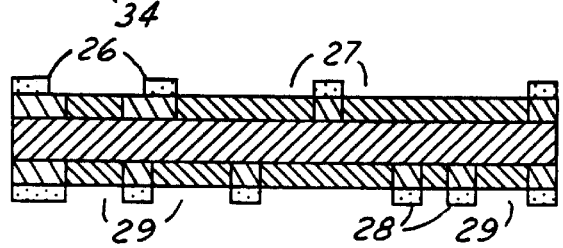
Figure 2E:
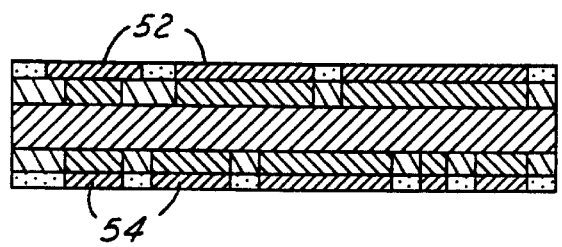
Figure 2F:
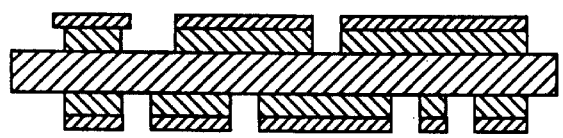
Figure 2G:
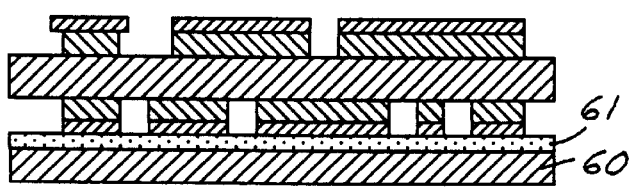
Figure 2H:
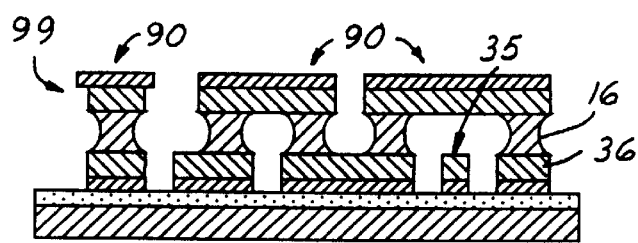

Referring now to the drawings, FIGS. 1A and 2A–H illustrate a first, preferred method for producing a multilayer circuit board having strengthened air bridge crossovers according to the present invention. This method involves the steps of: (a) providing a central layer/metal foil 10 made of a first metal and having top and bottom foil surfaces 12/14 (FIG. 2A); (b) applying first top and bottom plating resist masks 22/24 to the top and bottom foil surfaces, respectively, wherein the first top and bottom plating resist masks have respective first apertures 23/25 defined therein corresponding to respective predefined top and bottom conductor patterns (FIG. 2B); (c) pattern-plating top and bottom conductor networks 32/34 made of a second metal onto the top and bottom foil surfaces, respectively, through the first apertures in the first top and bottom plating resist masks (FIG. 2C); (d) applying second top and bottom plating resist masks 26/28 atop the first top and bottom plating resist masks, respectively, wherein the second masks have respective second apertures 27/29 defined therein such that each second aperture is at least as large as and is generally centered atop a corresponding one of the first apertures (FIG. 2D); (e) pattern-plating top and bottom fortifying layers 52/54 made of a third metal onto the top and bottom conductor networks, respectively, through the second apertures (FIG. 2E); (f) stripping the second top and bottom plating resist masks 26/28 (FIG. 2F); (g) stripping the first top and bottom plating resist masks 22/24 (FIG. 2F); (h) attaching the bottom conductor network 34 to a substrate 60 through an electrically insulative adhesive 61 (FIG. 2G); and (i) etching away the metal foil 10 except for those portions 16 thereof sandwiched between the top and bottom conductor networks 32/34, thereby forming air bridge crossover structures 90 (FIG. 2H). Note that in FIG. 2F, steps (f) and (g) of stripping the second and first masks, respectively, have been combined.

To assist the reader in understanding the present invention, all reference numbers used herein are summarized in the table below, along with the elements they represent:

10=Central layer . . . (1st metal)
12=Top surface of central layer
14=Bottom surface of central layer
16=Pedestal/support element of air bridge
22=First top plating resist mask
23=First apertures in first top mask
24=First bottom plating resist mask
25=First apertures in first bottom mask
26=Second top plating resist mask
27=Second apertures in second top mask
28=Second bottom plating resist mask
29=Second apertures in second bottom mask
32=Top conductor network . . . (2nd metal)
33=Bridging element
33e=Enlarged end of bridging element
33c=Constricted portion of bridging element
34=Bottom conductor network . . . (2nd metal)
35=Circuit trace
36=Support element pad
42=First top etch-resist mask
43=First apertures in first top etch-resist mask
44=First bottom etch-resist mask
45=First apertures in first bottom etch-resist mask
52=Top fortifying layer . . . (3rd metal)
54=Bottom fortifying layer . . . (3rd metal)

60=Substrate
61=Electrically insulative adhesive on substrate
90=Air bridge crossover structure
99=Air bridge having T-shaped cross-section The fortifying layers 52/54 may be made of a metal different from the conductor network layers 32/34 onto which each fortifying layer is plated, or it may be made of the same metal as the fortifying layers. This process has the advantage of providing a way of producing generally "T-shaped" (or similarly shaped) air bridge cross-sections as indicated by reference numeral 99 in FIG. 2H. Such air bridges with T-shaped or similarly shaped cross-sections are particularly resistant to mechanical stresses caused by bending, flexure, differential thermal expansion, etc., thus providing a mechanically fortified air bridge structure. Also, regardless of the shape of the air bridge cross-section, the provision of additional metallic cross-sectional area increases the current-carrying capacity of such bridges, thus providing an electrically fortified bridge structure as well.

These T-shaped bridges 99 are formed by applying two plating resist layers to each side of the circuit—i.e., first and second top masks 22/26 to the "top" side of the circuit, and first and second bottom masks 24/28 to the "bottom" side of the circuit, as illustrated in FIG. 2D. The apertures 23/25/27/29 are sized and arranged such that each first aperture 23/25 has a corresponding second aperture 27/29 generally centered thereatop, with each second aperture being at least as large as—or optionally larger than—its corresponding first aperture. For those aperture sets where the second aperture 27/29 is sized larger than its respective first aperture 23/25, the resulting air bridge element 99 will have a generally T-shaped (or similarly shaped) cross-section after the masks are stripped and the associated conductor layer portions 32/34 and fortifying layer portions 52/54 are exposed, as illustrated in FIG. 2H. Such T-shaped cross-sections cannot be created using conventional single masks, but require the application of two masks to each side of the circuit, with selected second apertures being sized larger than their corresponding first apertures. This process can be carried out using conventional photoimageable organic masks or similar processes which provide the alignment capabilities required to assure that the second apertures are adequately centered atop their respective first apertures.

Care should be given to select metals for the various circuit layers which satisfy at least two criteria: (1) the metals of adjacent layers must be platable/claddable onto each other in the prescribed order (either directly or through optional conversion layers), and (2) the metals must be selectively etchable with respect to each other. (By "selectively etchable" it is meant that one or more selected metals must be etchable in a given etchant without the etchant appreciably etching the other metals.) Examples of the first, second, and third metals include: (1) aluminum, copper, and nickel, respectively; (2) copper, nickel, and gold, respectively; and (3) steel, copper, and nickel, respectively. Many other combinations of suitable metals are also possible and within the scope of the present invention.

Figure 1B:
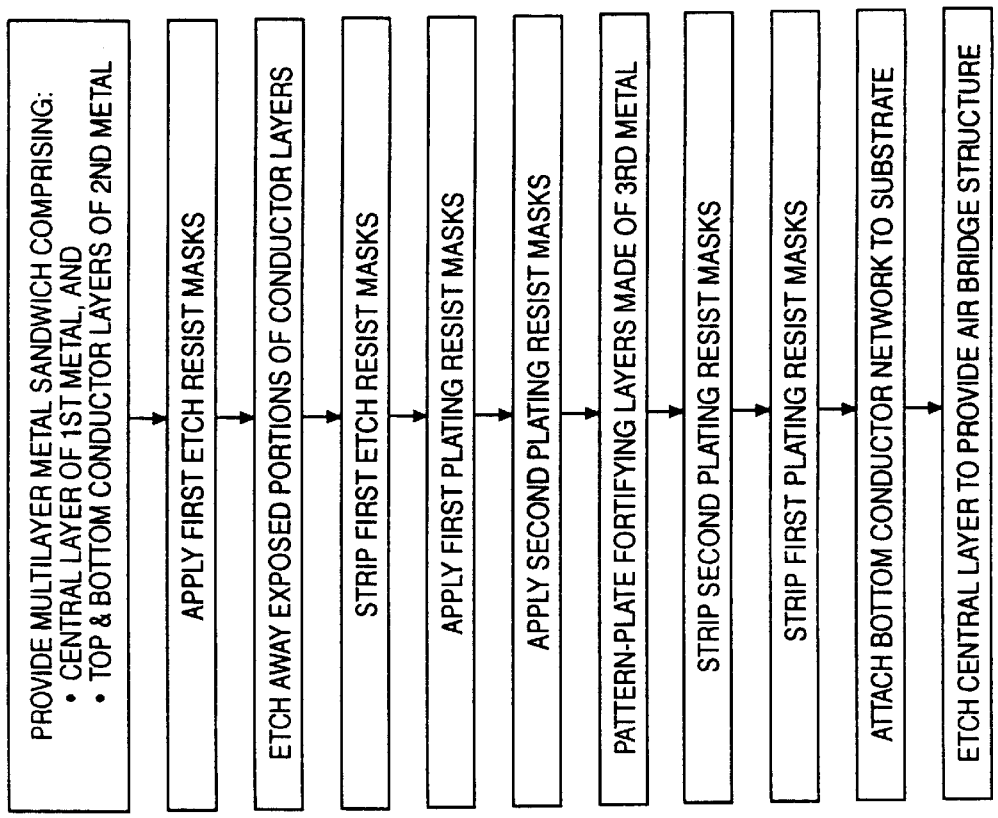
FIGS. 1A–B are flowcharts of the steps for two related approaches for producing a multilayer air bridge circuit according to the present invention.
Figure 1A:
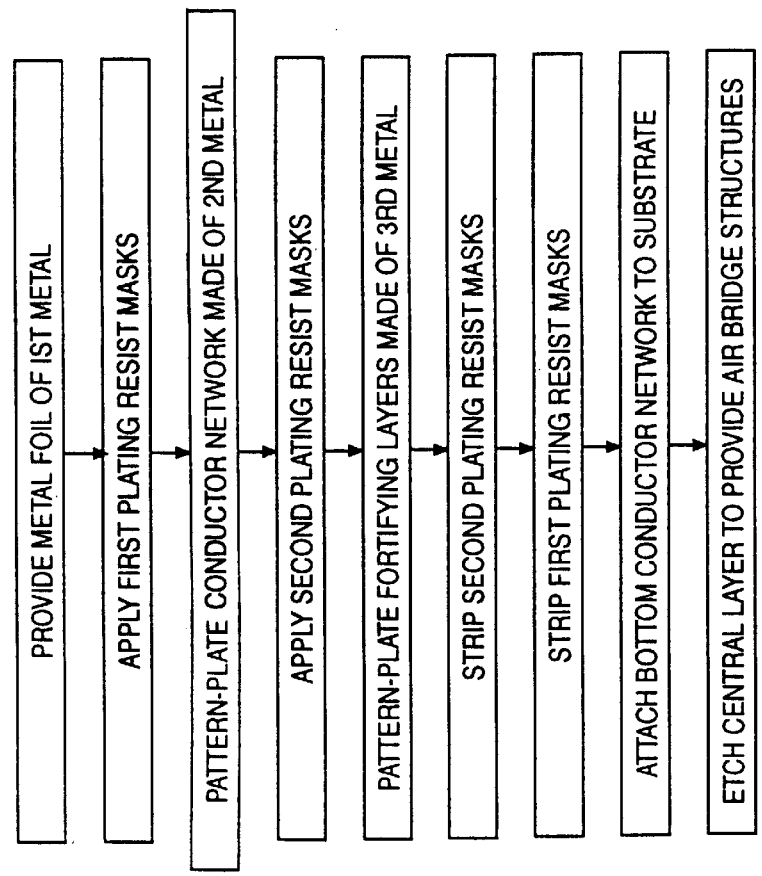

As taught in Livshits, Akiyama and Belke, the bottom conductor network 34 generally comprises a plurality of circuit traces 35 and support element pads 36; typically, the support element pads 36 are arranged in pairs proximate a corresponding circuit trace 35, with one pad 36 on either side of the trace 35. The top conductor network 32 comprises at least one bridging element 33 having first and second enlarged ends 33e with at least one constricted portion 33c contiguous with and between (i.e., connecting) the enlarged ends, such as the "dumbbell" shapes illustrated in FIG. 4, and in FIGS. 1h and 2c of Livshits. Each bridging element 33 is generally oriented transverse to a corresponding circuit trace, with each enlarged end thereof disposed opposite/atop a respective one of the support element pads.

It should be noted that whenever reference is made herein to "etching" a particular layer, it is generally intended that an etchant be used which etches substantially only the metal of which that particular layer is made. For example, when it is mentioned that the metal foil 10 is to be etched, it is meant that the etchant used will etch substantially only the first metal and will not appreciably etch the second and third metals. However, for the sake of efficiency, it may be desirable to combine certain etching steps by using an etchant which etches all of the metals to be etched in such steps.

The substrate 60 may be metal, plastic, ceramic, or any other suitable material, with the adhesive 61 being, for example, a thermoset epoxy applied to the substrate. Alternatively, the substrate 60 itself may be an adhesive (e.g., thermoset epoxy, thermoplastic resin, etc.) with element 61 simply being an integral surface of the substrate. In any case, it is required that the adhesive/surface 61 be electrically insulative in order to avoid shorts among the bottom conductor network elements.

Figure 3A:
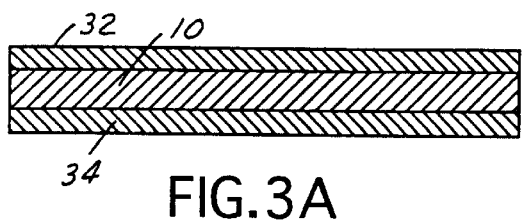
FIGS. 3A–J are successive sectional side views of a multilayer air bridge circuit being produced according to a second approach of the present invention.
Figure 3F:
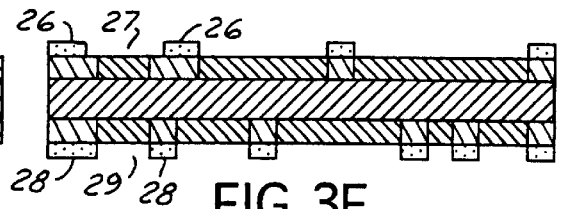
Figure 3B:
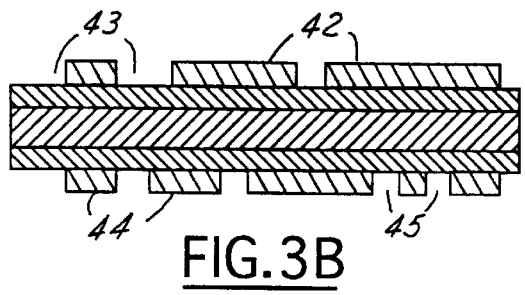
Figure 3G:
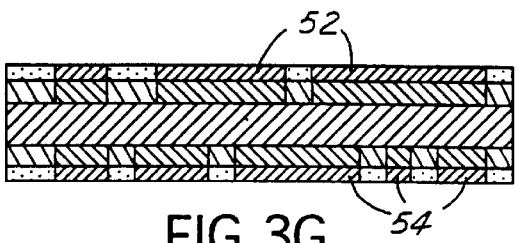
Figure 3C:
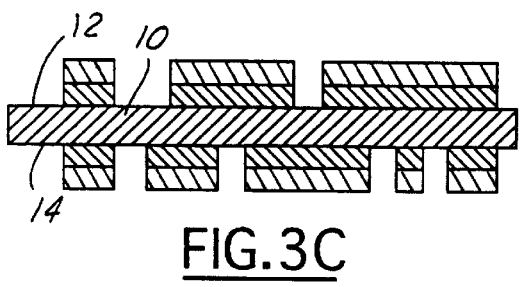
Figure 3H:
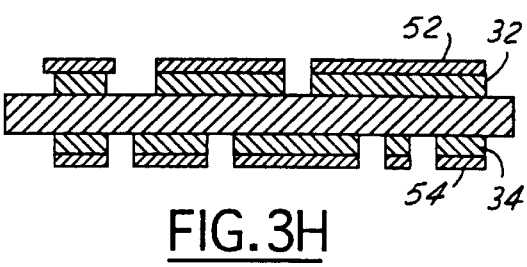
Figure 3D:
Figure 3I:
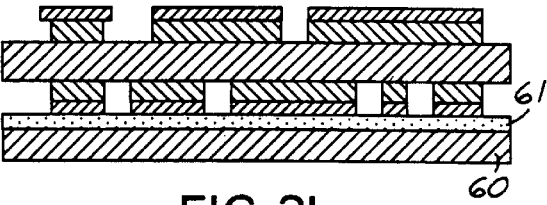
Figure 3E:
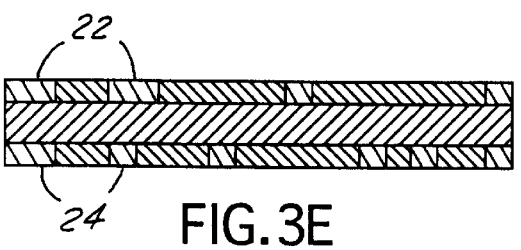

An alternative, subtractive process embodiment to the foregoing preferred, additive embodiment is illustrated in FIGS. 1B and 3A–J. This process comprises the steps of: (a) providing a multilayer metal sandwich comprising a central layer 10 made of a first metal and top and bottom conductor network layers 32/34 made of a second metal attached to respective top and bottom surfaces 12/14 of the central layer 10 (FIG. 3A); (b) applying first top and bottom etch-resist masks 42/44 to the top and bottom conductor network layers, respectively, wherein the top and bottom etch resist masks are configured to correspond to respective predefined top and bottom conductor patterns, the first masks further having first apertures 43/45 defined therein through which exposed portions of the conductor network layers and of the central layer are defined (FIG. 3B); (c) etching away the exposed portions of the conductor network layers (FIG. 3C); (d) stripping the first top and bottom etch-resist masks 42/44, thereby exposing formerly-masked top and bottom conductor network portions, respectively (FIG. 3D); (e) applying first top and bottom plating resist masks 22/24 atop the exposed portions of the central layer so as to fill in the etched-away portions of the conductor network layers substantially flush with the outer surfaces of the formerly-masked top and bottom conductor network portions (FIG. 3E); (f) applying second top and bottom plating resist masks 26/28 atop the first top and bottom plating resist masks 22/24, respectively, wherein the second top and bottom masks have second apertures 27/29 defined therein such that each second aperture is at least as large as and is generally centered atop a corresponding top or bottom conductor network portion (FIG. 3F); (g) pattern-plating top and bottom fortifying layers 32/34 made of a third metal atop the top and bottom conductor network portions, respectively, through the second apertures (FIG. 3G); (h) stripping the second top and bottom plating resist masks 26/28 (FIG. 3H); (i) stripping the first top and bottom plating resist masks 22/24 (FIG. 3H); (j) attaching the bottom conductor network portions to a substrate 60 through an electrically insulative adhesive 61; and (k) etching away the central layer 10 except for those portions 16 thereof sandwiched between the top and bottom conductor network portions, thereby forming air bridge crossover structures 90. As with the above preferred method, the mask-stripping steps (h) and (i) of the present alternative method have been combined in FIG. 3H.

Figure 3J:
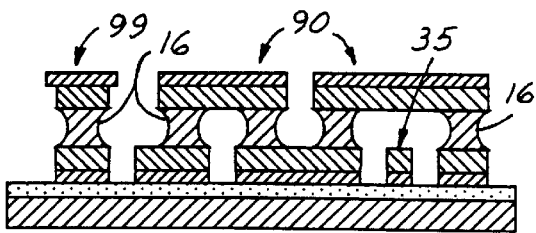
Figure 4:
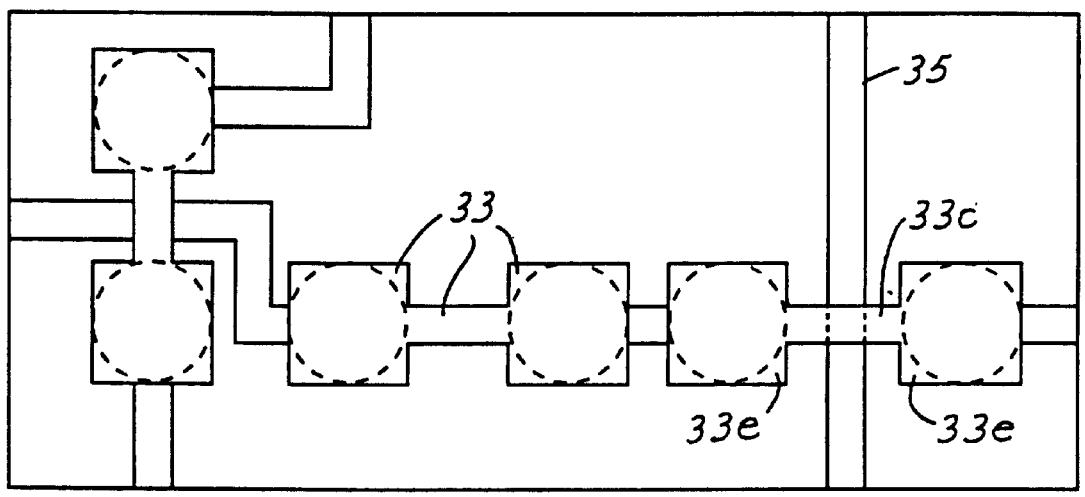
FIG. 4 is a top view of the circuits of FIGS. 2H and 3J.

Although the foregoing preferred/additive and alternative/subtractive processes are different from one another as far as the specific sequence of steps each process follows, the final multilayer air bridge circuit structures produced by these processes are substantially identical. This is made clear by comparing the final structures shown in FIGS. 2H and 3J. The final structure—a multilayer electronic air bridge crossover circuit assembly made of first, second, and third metals, as shown in FIGS. 2H, 3J, and 4—comprises: (a) a substrate 60 having an electrically insulative surface 61; (b) a bottom conductor network attached to the electrically insulative surface and comprising a circuit trace 35 and first and second support element pads 36 disposed proximate the circuit trace on opposite sides thereof, the bottom conductor network having a bi-laminate structure comprising (b1) a first layer 54 attached to the electrically insulative surface and made of the third metal, and (b2) a second layer 34 attached atop the first layer 54 and made of the second metal; (c) a support element 16 attached atop each support element pad 36 and made of the first metal; (d) a top conductor network including a generally elongate bridging element 33 having first and second enlarged ends 33e and at least one constricted portion 33c therebetween, the bridging element being oriented generally transverse to the circuit trace 35 with each enlarged end thereof attached atop a respective one of the support elements, the top conductor network having a bi-laminate structure comprising (d1) a third layer 32 attached to the support elements and made of a the second metal, and (d2) a fourth layer 52 attached atop the third layer and made of the third metal; (e) wherein the fourth layer is sized larger than the third layer, such that the bridging element has a generally T-shaped cross-section. Although the foregoing description defines the invention in terms of a single circuit trace and a single air bridge crossover element, it should be apparent that the present invention includes circuit boards having multiple circuit traces and air bridge crossovers.

Various other modifications to the present invention may occur to those skilled in the art to which the present invention pertains. For example, it should be apparent that performing one or more cleaning, microetching, or other metal-prep steps may be desired prior to any given plating step. Also, while the "etching" steps herein have been described generally in terms of chemical etching, equivalent processes such as plasma etching, laser ablation, and other metal removal steps may be used instead of or in addition to conventional chemical etching. Additionally, while electrolytic plating may be a preferred plating method for the plating steps mentioned herein, it is also possible that electroless, immersion, or other methods of plating may also be used. Furthermore, it should be noted that although the terms "pattern-plating" and "plating" are variously used herein, methods of metal deposition other than "plating" may alternatively be used and are within the scope of the present invention. Examples of such alternative but equivalent processes include, but are not limited to, sputtering, vacuum metallization/deposition, thermal spraying, dip coating, and the like. Thus, as used herein, any reference to "plating" (including pattern-plating and panel-plating) should be construed to include the foregoing approaches and their equivalents. Moreover, it should be apparent that it is possible to utilize either of the preferred or alternative methods to produce air bridge structures which include only one T-shaped air bridge element, or multiple such elements, or structures where all of the air bridges exhibit this generally T-shaped cross-section. Other modifications not explicitly mentioned herein are also possible and within the scope of the present invention. It is the following claims, including all equivalents, which define the scope of the present invention.

What is claimed is:

1. A method for additively producing a multilayer circuit board having air bridge crossovers, comprising the steps of:
   (a) providing a metal foil made of a first metal and having top and bottom foil surfaces;
   (b) applying first top and bottom plating resist masks to the top and bottom foil surfaces, respectively, wherein the first top and bottom plating resist masks have respective first apertures defined therein corresponding to respective predefined top and bottom conductor patterns;
   (c) pattern-plating top and bottom conductor networks made of a second metal onto the top and bottom foil surfaces, respectively, through the first apertures in the first top and bottom plating resist masks;
   (d) applying second top and bottom plating resist masks atop the first top and bottom plating resist masks, respectively, wherein the second masks have respective second apertures defined therein such that each second aperture is at least as large as and is generally centered atop a corresponding one of the first apertures;
   (e) pattern-plating top and bottom fortifying layers made of a third metal onto the top and bottom conductor networks, respectively, through the second apertures;
   (f) stripping the second top and bottom plating resist masks;
   (g) stripping the first top and bottom plating resist masks;
   (h) attaching the bottom conductor network to a substrate through an electrically insulative adhesive; and
   (i) etching away the metal foil except for those portions thereof sandwiched between the top and bottom conductor networks, thereby forming air bridge crossover structures.

2. A method according to claim 1, wherein steps (f) and (g) are performed generally simultaneously.

3. A method according to claim 1, wherein at least one of the second apertures is sized larger that its corresponding first aperture.

4. A method according to claim 3, wherein the air bridge crossover structure corresponding to the at least one second aperture has a generally T-shaped cross-section.

5. A method according to claim 1, further comprising after step (a) and before step (c) the step of cleaning the top and bottom foil surfaces so as to remove any oxidized material therefrom.

6. A method according to claim 1, wherein:
   the bottom conductor network includes a circuit trace and first and second support element pads disposed proximate the circuit trace on opposite sides thereof; and
   the top conductor network includes a bridging element having first and second enlarged ends and at least one constricted portion therebetween, the bridging element being oriented generally transverse to the circuit trace with each enlarged end disposed opposite a respective one of the support element pads.

7. A method according to claim 1, wherein the first, second, and third metals are:
   aluminum, nickel, and copper, respectively; or
   copper, gold, and nickel, respectively; or
   steel, nickel, and copper, respectively.

8. A method for subtractively producing a multilayer circuit board having air bridge crossovers, comprising the steps of:

(a) providing a multilayer metal sandwich comprising a central layer made of a first metal and top and bottom conductor network layers made of a second layer attached to respective top and bottom surfaces of the central layer;

(b) applying first top and bottom etch resist masks to the top and bottom conductor network layers, respectively, wherein the top and bottom etch resist masks are configured to correspond to respective predefined top and bottom conductor patterns, the first masks further having first apertures defined therein through which exposed portions of the conductor network layers and of the central layer are defined;

(c) etching away the exposed portions of the conductor network layers;

(d) stripping the first top and bottom etch resist masks, thereby exposing formerly-masked top and bottom conductor network portions, respectively;

(e) applying first top and bottom plating resist masks atop the exposed portions of the central layer so as to fill in the etched-away portions of the conductor network layers substantially flush with the outer surfaces of the formerly-masked top and bottom conductor network portions;

(f) applying second top and bottom plating resist masks atop the first top and bottom plating resist masks, respectively, wherein the second top and bottom masks have second apertures defined therein such that each second aperture is at least as large as and is generally centered atop a corresponding top or bottom conductor network portion;

(g) pattern-plating top and bottom fortifying layers made of a third metal atop the top and bottom conductor network portions, respectively, through the second apertures;

(h) stripping the second top and bottom plating resist masks;

(i) stripping the first top and bottom plating resist masks;

(j) attaching the bottom conductor network portions to a substrate through an electrically insulative adhesive; and (k) etching away the central layer except for those portions thereof sandwiched between the top and bottom conductor network portions, thereby forming air bridge crossover structures.

9. A method according to claim 8, wherein steps (h) and (i) are performed generally simultaneously.

10. A method according to claim 8, wherein at least one of the second apertures is sized larger that its corresponding top or bottom conductor network portion.

11. A method according to claim 10, wherein the air bridge crossover structure corresponding to the at least one second aperture has a generally T-shaped cross-section.

12. A method according to claim 8, wherein:
the bottom conductor network portions include a circuit trace and first and second support element pads disposed proximate the circuit trace on opposite sides thereof; and
the top conductor network portions include a bridging element having first and second enlarged ends and at least one constricted portion therebetween, the bridging element being oriented generally transverse to the circuit trace with each enlarged end disposed opposite a respective one of the support element pads.

13. A method according to claim 8, further comprising before step (g) the step of cleaning the top and bottom conductor network portions so as to remove any oxidized material therefrom.

14. A method according to claim 8, wherein the first, second, and third metals are:
aluminum, nickel, and copper, respectively; or
copper, gold, and nickel, respectively; or
steel, nickel, and copper, respectively.

* * * * *